(12) United States Patent
Callant et al.

(10) Patent No.: US 7,527,916 B2
(45) Date of Patent: May 5, 2009

(54) PHOTOPOLYMERIZABLE COMPOSITION

(75) Inventors: Paul Callant, Edegem (BE); Marc Van Damme, Bonheiden (BE)

(73) Assignee: Agfa Graphics, N.V., Mortsel (BE)

( * ) Notice: Subject to any disclaimer, the term of this patent is extended or adjusted under 35 U.S.C. 154(b) by 410 days.

(21) Appl. No.: 10/573,193

(22) PCT Filed: Sep. 1, 2004

(86) PCT No.: PCT/EP2004/051987

§ 371 (c)(1),
(2), (4) Date: Jun. 16, 2006

(87) PCT Pub. No.: WO2005/002187

PCT Pub. Date: Mar. 31, 2005

(65) Prior Publication Data

US 2007/0032564 A1    Feb. 8, 2007

(30) Foreign Application Priority Data

Sep. 22, 2003    (EP)    .................. 03103499

(51) Int. Cl.
C07C 43/20    (2006.01)
G03F 7/00    (2006.01)

(52) U.S. Cl. .......... 430/281.1; 522/16; 522/26; 522/173; 522/176; 522/182; 568/642; 568/646

(58) Field of Classification Search .......... 522/77, 522/16, 26, 173, 176, 179, 182; 430/281.1; 568/642, 646
See application file for complete search history.

(56) References Cited

U.S. PATENT DOCUMENTS

| 3,784,557 | A | | 1/1974 | Cescon |
| 3,907,904 | A | * | 9/1975 | Luethi .................. 568/643 |
| 4,088,498 | A | | 5/1978 | Faust |
| 4,250,248 | A | | 2/1981 | Faust |
| 4,459,349 | A | | 7/1984 | Tanaka et al. |
| 5,066,564 | A | | 11/1991 | Zertani et al. |
| 5,273,862 | A | | 12/1993 | Zertani et al. |
| 5,629,354 | A | | 5/1997 | West et al. |
| 5,707,781 | A | | 1/1998 | Wilczak |
| 5,914,215 | A | | 6/1999 | West et al. |
| 5,942,372 | A | | 8/1999 | West et al. |
| 6,197,472 | B1 | | 3/2001 | Konrad et al. |
| 6,576,396 | B1 | | 6/2003 | Leichsenring et al. |
| 2003/0186165 | A1 | | 10/2003 | Gries et al. |

FOREIGN PATENT DOCUMENTS

| DE | 3 211 312 | A1 | 10/1982 |
| EP | 0 024 629 | A2 | 3/1981 |
| EP | 0 107 792 | A1 | 5/1984 |
| EP | 0 215 453 | A2 | 3/1987 |
| EP | 0 355 387 | A2 | 2/1990 |
| EP | 0 730 201 | A1 | 9/1996 |
| EP | 0 741 333 | A1 | 11/1996 |
| EP | 0 985 683 | A1 | 3/2000 |
| EP | 1 035 435 | A2 | 9/2000 |
| EP | 1 048 982 | A1 | 11/2000 |
| EP | 1 070 990 | A1 | 1/2001 |
| EP | 1 091 247 | A2 | 4/2001 |
| EP | 1 349 006 | A1 | 10/2003 |
| WO | WO 97/35232 | A1 | 9/1997 |

OTHER PUBLICATIONS

International Search Report for PCT/EP2004/051987 (Feb. 2, 2005).

* cited by examiner

*Primary Examiner*—Susan W Berman
(74) *Attorney, Agent, or Firm*—Leydig, Voit & Mayer, Ltd

(57) ABSTRACT

A composition that is photopolymerizable upon absorption of light in the wavelength range from 300 to 450 nm, the composition comprising a binder, a polymerizable compound, a sensitizer and a photoinitiator, characterized in that the sensitizer is an optical brightening agent having a solubility in methyl ethyl ketone of at least 15 g/kg measured at 20° C., allows to produce printing plates without pinhole defects, even if the printing plate precursor is stored before exposure and processing.

17 Claims, No Drawings

PHOTOPOLYMERIZABLE COMPOSITION

FIELD OF THE INVENTION

The present invention relates to a photopolymerizable composition which is sensitized for the wavelength range from 300 to 450 nm and which comprises an optical brightening agent as sensitizer. The invention also relates to a printing plate precursor comprising said composition and a method for making a printing plate therewith.

BACKGROUND OF THE INVENTION

In lithographic printing, a so-called printing master such as a printing plate is mounted on a cylinder of the printing press. The master carries a lithographic image on its surface and a printed copy is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called "driographic" printing, the lithographic image consists of ink-accepting and ink-abhesive (ink-repelling) areas and during driographic printing, only ink is supplied to the master.

Printing masters are generally obtained by the so-called computer-to-film (CtF) method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master. Since about 1995, the so-called 'computer-to-plate' (CtP) method has gained a lot of interest This method, also called 'direct-to-plate', bypasses the creation of film because the digital document is transferred directly to a plate precursor by means of a so-called plate-setter. A plate precursor for CtP is often called a digital plate.

Digital plates can roughly be divided in three categories: (i) silver plates, which work according to the silver salt diffusion transfer mechanism; (ii) photopolymer plates which contain a photopolymerizable composition that hardens upon exposure to light and (iii) thermal plates of which the imaging mechanism is triggered by heat or by light-to-heat conversion. Thermal plates are mainly sensitized for infrared lasers emitting at 830 nm or 1064 nm. Typical photopolymer plates are sensitized for visible light, mainly for exposure by an Ar laser (488 nm) or a FD-YAG laser (532 nm). The wide-scale availability of low cost blue or violet laser diodes, originally developed for data storage by means of DVD, has enabled the production of plate-setters operating at shorter wavelength. More specifically, semiconductor lasers emitting from 350 to 450 nm have been realized using an InGaN material.

Photopolymer plates sensitized for the wavelength range from 350 to 450 nm have also been described in the prior art. Photopolymer plates generally contain a polymerizable monomer, a binder, a photoinitiator and a sensitizing dye. EP-A 985683. describes a composition comprising a titanocene compound as photoinitiator and specific dyes as sensitizers for the wavelength range from 350 to 450 nm. FP-A 1035435 discloses a 1,3-dihydro-1-oxo-2H-indene derivative as sensitizing dye. EP-As 1048982 and 1070990 also discloses certain dyes in combination with a titanocene photoinitiator. A wide range of dyes for the wavelength range from 300 to 1200 nm is disclosed in EP-A 1091247. The sensitizing dyes disclosed in the prior art do not produce sufficient speed (sensitivity) to enable a short exposure time with the commercially available blue or violet laser diodes. Typical low-cost blue or violet laser diodes have a light output characterized by low power.

The known photopolymer printing plate precursors are unsatisfactory, because they result in printing plates of minor or even unacceptable quality because of so called pinhole defects, that have an irregular crystal-like shape. Defects called pinholes are areas having lateral dimensions of about 50 to 500 μm on the processed printing plate, that don't take up ink and therefore result in exposed areas that don't print. This unfavourable effect is particularly noticeable, if the printing plate precursor is stored before exposure and processing thereof.

SUMMARY OF THE INVENTION

It is an object of the present invention, to provide a high-speed composition that is photopolymerizable upon absorption of light in the wavelength range between 300 and 450. nm and that enables to produce imaging materials, such as printing plates or photoresist materials, which don't have pinhole defects. That object is surprisingly realized by a photopolymerizable composition, wherein a sensitizer having a solubility in methyl ethyl ketone of at least 15 g/kg measured at 20° C. is used.

When said composition is coated on a suitable support, a printing plate precursor according to the present invention is obtained that is sensitive to the wavelength range from 300 to 450 nm. The printing plate precursor of the present invention is a flexographic or lithographic printing plate precursor, the latter being highly preferred. Also a method of making a printing plate wherein said printing plate precursor is exposed with a laser having an emission in the wavelength range from 300 to 450 nm, is an aspect of the present invention. Preferred photopolymer plate precursors according to the present invention can be exposed with an energy density, measured on the surface of the plate of 100 μJ/cm$^2$ or less. Preferred embodiments of the composition, of the printing plate precursor, of the method of making a printing plate and of the use according to the present invention are defined in the dependent claims.

DETAILED DESCRIPTION OF THE INVENTION

The present invention relates to a composition (photopolymerizable composition) that is photopolymerizable upon absorption of light in the wavelength range from 300 to 450 nm, preferably from 350 to 430 nm and particularly preferred from 360 to 420 nm, the composition comprising a binder, a polymerizable compound, a sensitizer and a photoinitiator, characterized in that the sensitizer is an optical brightening agent having a solubility in methyl ethyl ketone of at least 15 g/kg measured at 20° C.

When searching for the reason, why the known printing plate precursors result in printing plates with pinhole defects, it was surprisingly found, that the sensitizer has a great influence on the tendency that pinholes appear, the most important factor being the solubility of the sensitizer in methyl ethyl ketone.

When using a sensitizer having a solubility in methyl ethyl ketone of at least 15 g/kg measured at 20° C., only an acceptable amount of pinholes appears, and preferred sensitizers have a solubility in methyl ethyl ketone of from 15 to 250 g/kg measured at 20° C.

But also the structure has been found to be of importance for the appearance of pinholes and it has been found, that optical brightening agents are preferred sensitizers for printing plate precursor of the present invention and allow, in combination with the solubility disclosed above, to prepare printing plates that are essentially free from pinholes and even completely free of pinholes.

Although not knowing about the mechanism, it is thought, that the sensitizing dyes of the present invention have a good compatibility with the other ingredients of the photopolymerisable layer and therefor don't induce the creation of pinholes.

A typical optical brightener, also known as "fluorescent whitening agent", is a colorless to weakly colored organic compound that is capable of absorbing light having a wavelength in the range between 300 and 450 nm and of emitting the absorbed energy as fluorescent light having a wavelength in the range between 400 and 500 nm. A description of the physical principle and the chemistry of optical brighteners is given in Ullmann's Encyclopedia of Industrial Chemistry, Sixth Edition, Electronic Release, Wiley-VCH 1998. Basically, suitable optical brightener contain π-electron systems comprising a carbocyclic or a heterocyclic nucleus. Suitable representatives of these compounds are e.g. stilbenes, distyrylbenzenes, distyrylbiphenyls, divinylstilbenes, triazinylaminostilbenes, stilbenyltriazoles, stilbenylnaphthotriazoles, bis-triazolstilbenes, benzoxazoles, bisphenylbenzoxazoles, stilbenylbenzoxazoles, bis-benzoxazoles, furans, benzofurans, bis-benzimidazoles, diphenylpyrazolines, diphenyloxadiazoles, coumarins, naphthalimides, xanthenes, carbostyrils, pyrenes and 1,3,5-triazinyl-derivatives.

More specifically, optical brightening agents having a structure according to one of the following formulae are preferred sensitizers for use in the composition of the present invention:

(III)

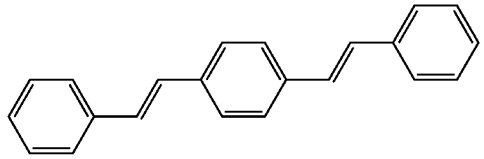

(IV)

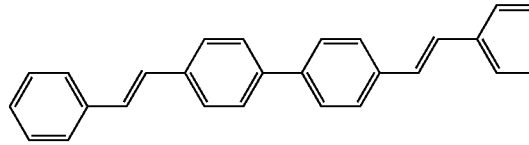

(V)

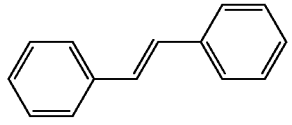

(VI)

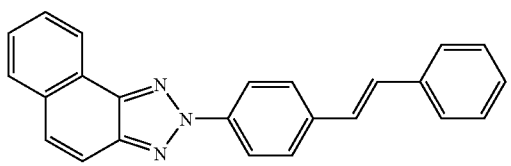

-continued (VII)

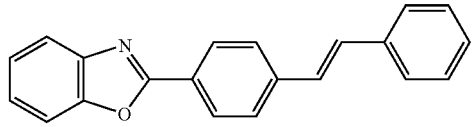

(VIII)

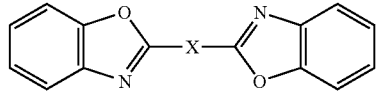

(IX)

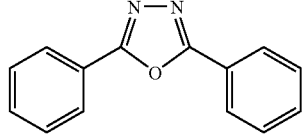

(X)

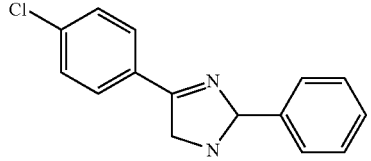

(XI)

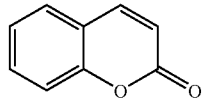

(XII)

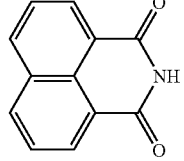

(XIII)

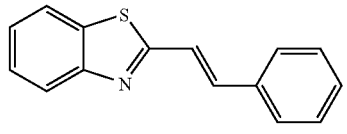

(XIV)

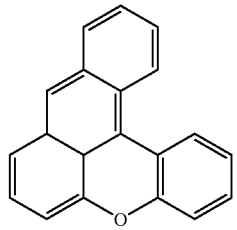

(XV)

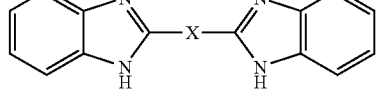

(XVI)

-continued

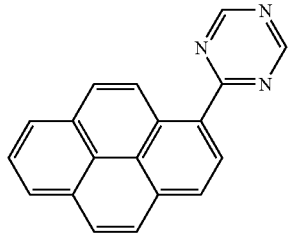
(XVII)

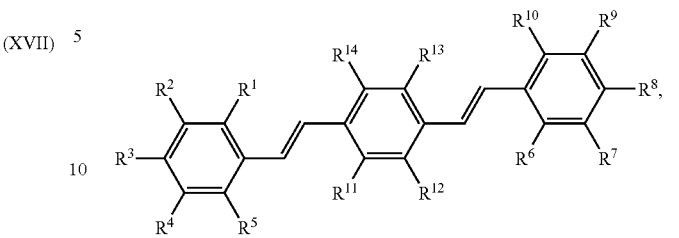
(IIIa)

wherein X is one of the following groups, * denoting the position of attachment in the above formulae:

wherein
R$^1$ to R$^{14}$ independently represent a hydrogen atom, an alkyl group, an alkoxy group, a cyano group or a halogen atom, and at least one of R$^1$ to R$^{10}$ represents an alkoxy group having more than 1 carbon atom;

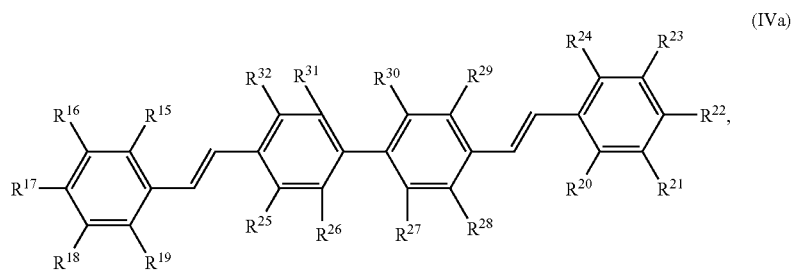
(IVa)

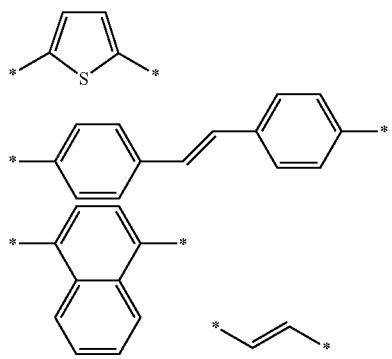

and wherein one or more of the nuclei in each of the above formulae (III) to (XVII) may be independently substituted by one or more groups selected from alkyl, alkoxy, alkylthio, cyano, halogeno, alkylcarbonyl, alkoxycarbonyl, acyloxy, carboxyl, nitrile, amino, hydroxyl, alkylsulfonyl and aminosulfonyl.

The optical brighteners can be used as a single compound or as a mixture of several materials. The overall amount of these compounds ranges from 0.1 to 10% by weight, preferably 0.5 to 8% by weight with respect to the total weight of the non-volatile compounds nm the composition. Highly preferred optical brighteners include compounds of formulae (III) and/or (I), and in particular compounds of formulae (IIIa) and/or (IVa):

wherein
R$^{15}$ to R$^{32}$ independently represent a hydrogen atom, an alkyl group, an alkoxy group, a cyano group or a halogen atom, and at least one of R$^{15}$ to R$^{24}$ represents an alkoxy group having more than 1 carbon atom. The alkyl and alkoxy groups of the present invention can be optionally substituted and their substituent can be selected to adjust the solubility of the sensitizer and may be, for example, halogen, ester, ether, thioether or hydroxy. The alkyl or alkoxy groups may be straight chain or cyclic, but a branched chain is preferred for the sensitizers of formulae (IIIa) and (IVa).

Particular advantages with respect to the pinhole defects are achieved with sensitisers of formula (IIIa), wherein R$^1$, R$^5$, R$^6$, R$^{10}$, R$^{11}$, R$^{12}$, R$^{13}$ and R$^{14}$ independently represent a hydrogen atom, a fluorine atom or a chlorine atom, in particular R$^1$, R$^5$, R$^6$, and R$^{10}$ being a hydrogen atom; R$^2$ to R$^4$, R$^7$ to R$^9$, independently are alkoxy groups; and at least two of the alkoxy groups are branched and have from 3 to 15 carbon atoms. Especially preferred for the present invention are sensitizers of formulae (IIIa) as disclosed above, wherein R$^2$, R$^4$, R$^7$, R$^9$. independently represent a methoxy group and R$^3$ and R$^8$ independently are branched alkoxy groups having 3 to 15 carbon atoms.

Particular advantages with respect to the pinhole defects are also achieved with sensitisers of formula (IVa), wherein R$^{15}$, R$^{19}$, R$^{20}$, R$^{24}$, R$^{25}$ to R$^{32}$, independently represent a hydrogen atom, a fluorine atom or a chlorine atom, in particular R$^{15}$, R$^{19}$, R$^{20}$, R$^{24}$ being a hydrogen atom; R$^{16}$ to R$^{18}$, R$^{21}$ to R$^{23}$, independently are alkoxy groups; and at least two of the alkoxy groups are branched and have from 3 to 15 carbon atoms. Especially preferred for the present invention are sensitizers of formulae (IVa) as disclosed above, wherein $R^{16}$, $R^{18}$, $R^{21}$, $R^{23}$ independently represent a methoxy group and $R^{17}$ and $R^{22}$ independently are branched alkoxy groups having 3 to 15 carbon atoms.

The following structures are examples of preferred sensitizers of the present invention and their solubility S is given in brackets as g sensitizer/kg methyl ethyl ketone measured at 20° C.

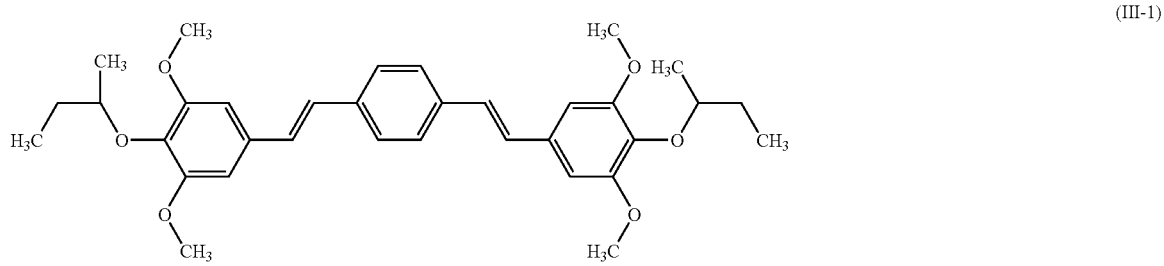

(III-1)

[S = 40]

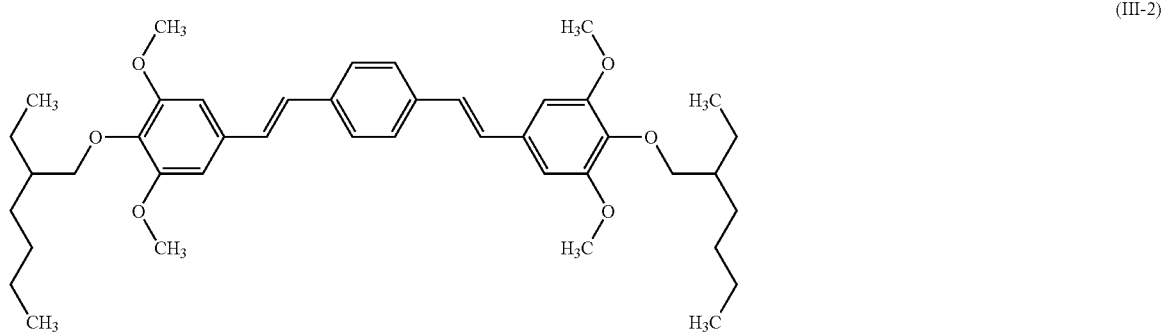

(III-2)

[S = 200]

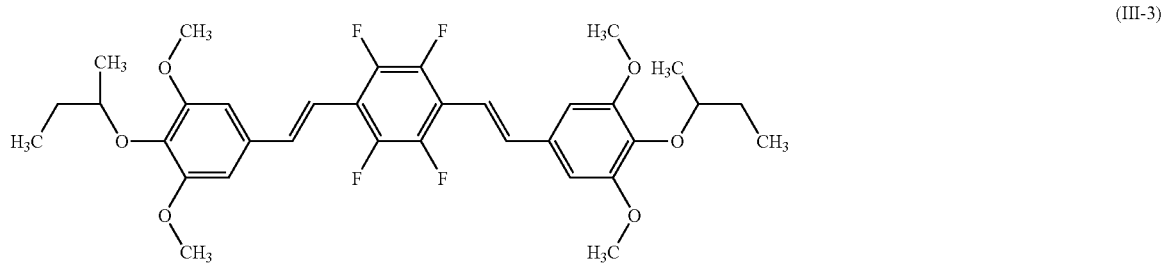

(III-3)

[S = 40]

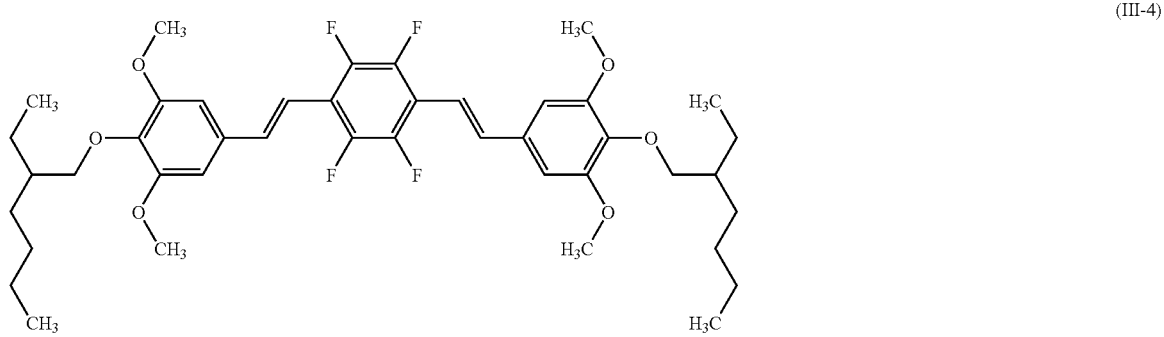

(III-4)

[S = 200]

(III-5)
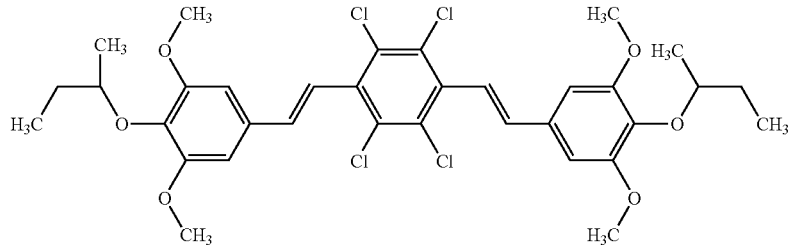
[S = 8]
(III-6)
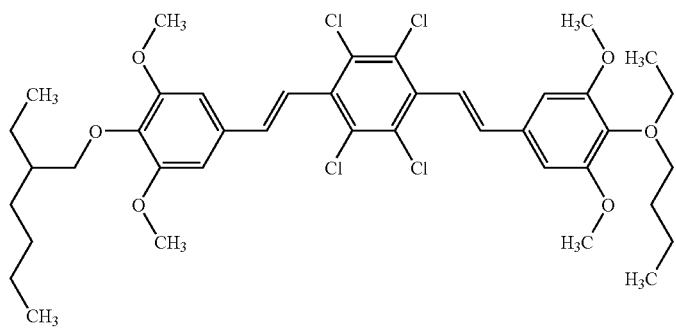
[S = 60]
(III-7) (III-8)
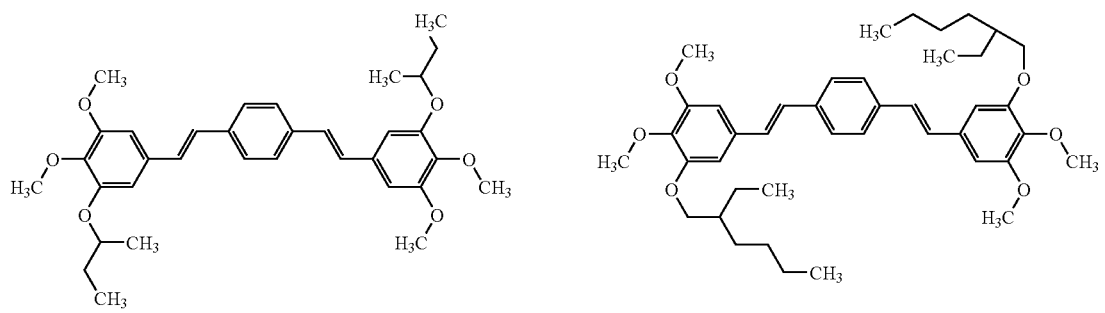
(III-9)
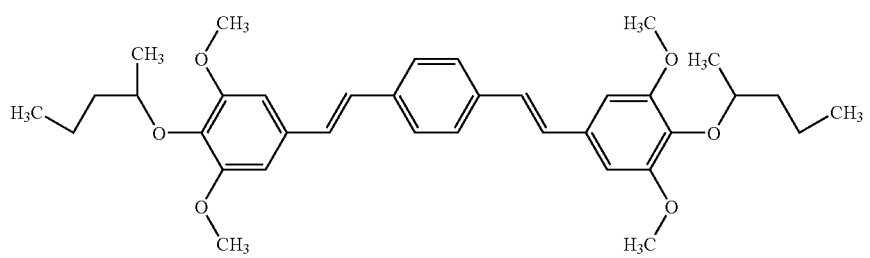
[S = 60]

-continued

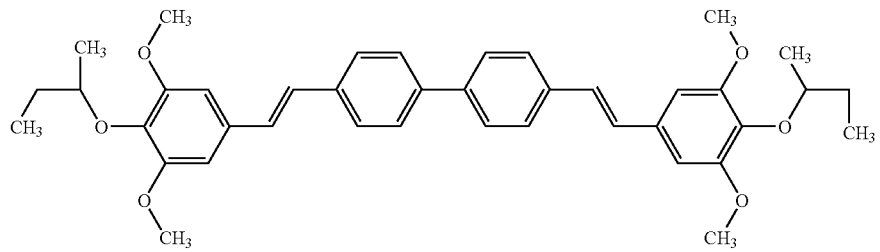

(IV-1)

[S = 80]

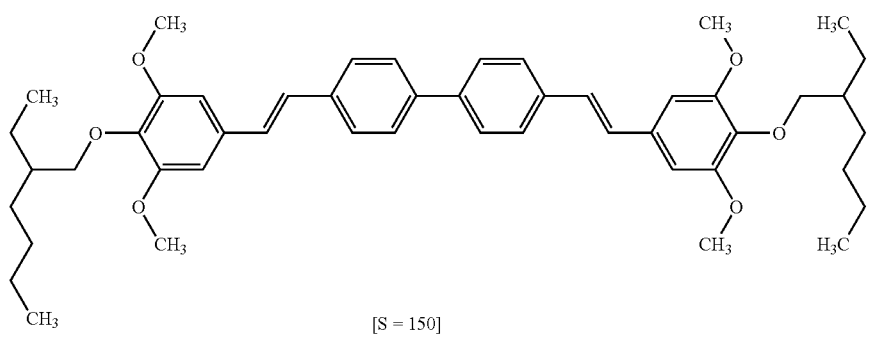

(IV-2)

[S = 150]

Most sensitizers useful for the present invention can be synthesised by known methods and the synthesis of the highly preferred sensitizers of formulae (IIIa) and (IVa) can be done in analogy to the synthesis of sensitizer (III-1) as disclosed in the following.

Synthesis of Intermediate (C-3)

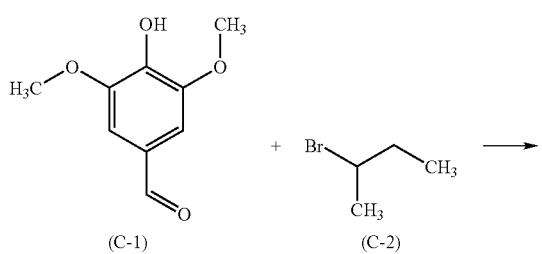

Synthesis of Sensitizer (III-1)

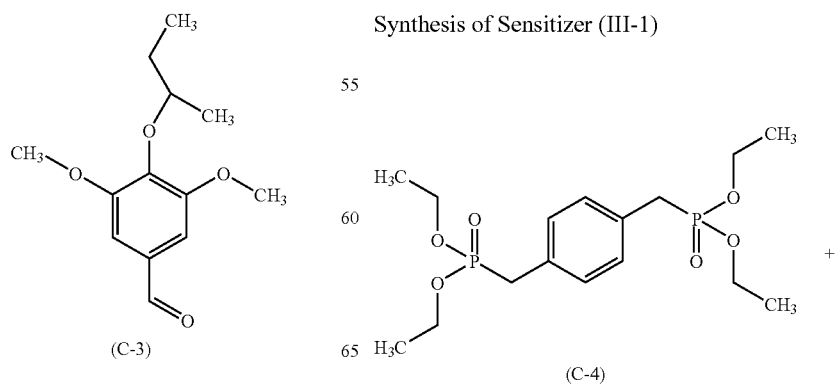

To a mixture of 8.365 kg (45.0 mol) syringaldehyde (C-1) and 1.494 kg (9.0 mol) potassium iodide is added 20.25 L sulfolane at room temperature. After heating up this mixture to 30° C. under nitrogen, 3.12 kg (47.25 mol) of KOH and 2.80 kg (20.25 mol) $K_2CO_3$ are added. After warming the reaction mixture to 75° C., 12.78 kg (90.0 mol) 2-bromo butane (C-2) is added over a period of 30 minutes. Heating at 75° C. is continued for 24 hours, followed by cooling to 25° C. Then 25. L Water is added and the reaction product is extracted with 18 L methyl t-butyl ether (MTBE). The organic phase is consecutively a) two times washed with 6.0 L of a 7.5 wt. % $K_2CO_3$. solution in water respectively, b) two times washed with 13.5 L of pure water respectively and finally, c) two times washed with 4.5 kg of a 20 wt. % NaCl solution in water respectively. The solvent (MTBE) is removed by distillation under reduced pressure of 50 mBar at 75° C. and thereby are obtained 7.845 kg (theoretical yield of 75%) of the crude intermediate (C-3) as a yellow oil, that is used in the synthesis of (III-1) without further purification.

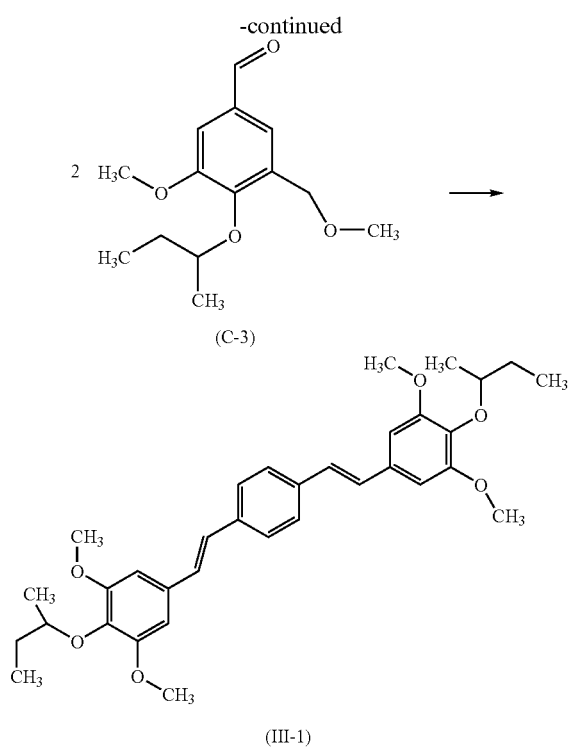

To a mixture of 9.63 kg (25.46 mol) p-xylylene-bis-phosphonate (C-4) and 12.13 kg (50.92 mol) of the crude intermediate (C-3) in 20 L THF, 4.70 kg (71.3 mol) of KOH is added at room temperature. After heating the stirred reaction mixture at reflux for 3.5 hours, the reaction product is precipitated by adding a mixture of 25.2 kg methanol and 9.9 kg water, followed by further cooling to 20° C. The crystalline product (III-1) is filtered off, washed with several portions of methanol/water on the filter and dried at 50° C. The yield is 9.05 kg (theoretical yield of 67%) of (III-1) having a melting point of 154° C.

A suitable synthesis for the p-xylylene-bis-phosphonate (C-4) is known from the literature, e.g. from B. P. Lugovkin and B. A. Arbuzov, Doklady Akademii Nauk SSSR (1948), 59, pages 1301 to 1304.

The known photopolymerization initiators can be used in the composition of the present invention. Suitable classes include aromatic ketones, aromatic onium salts, organic peroxides, thio compounds, hexaarylbisimidazole compounds, ketooxime ester pounds, borate compounds, azinium compounds, metallocene compounds, active ester compounds and compounds having a carbon-halogen bond. Many specific examples of such photoinitiators can be found in EP-A 1091247. The best results, in particular the highest sensitivity, can be obtained by the combination of an optical brightener as sensitizer and a hexaarylbisimidazole (HABI, dimer of triaryl-imidazole) as photoinitiator. A procedure for the preparation of HABIs is described in DE 1470 154 and their use in photopolymer-izable compositions is documented in EP 24 629, EP 107 792, U.S. Pat. No. 4,410,621, EP 215 453 and DE 3 211 312. Preferred derivatives are e.g. 2,4,5,2',4',5'-hexaphenylbisimidazole, 2,2'-bis(2-chlorophenyl)-4,5,4',5'-tetraphenylbisimidazole, 2,2'-bis(2-bromophenyl)-4,5,4',5'-tetraphenylbisimidazole, 2,2'-bis(2,4-dichlorophenyl)-4,5,4',5'-tetraphenylbisimidazole, 2,2'-bis(2-chlorophenyl)-4,5,4',5'-tetrakis(3-methoxyphenyl)bisimidazole, 2,2'-bis(2-chlorophenyl)4,5,4',5'-tetrakis(3,4,5-trimethoxyphenyl)-bisimidazole, 2,5,2',5'-tetrakis(2-chlorophenyl)-4,4'-bis(3,4-dimethoxyphenyl)bisimidazole, 2,2'-bis(2,6-dichlorophenyl)-4,5,4',5'-tetraphenylbisimidazole, 2,2'-bis (2-nitrophenyl)-4,5,4',5'-tetraphenylbisimidazole, 2,2'-di-o-tolyl-4,5,4',5'-tetraphenylbisimidazole, 2,2'-bis(2-ethoxyphenyl)-4,5,4',5'-tetraphenylbisimidazole and 2,2'-bis (2,6-difluorophenyl)-4,5,4',5'-tetraphenylbisimidazole. The amount of the HABI photoinitiator typically ranges from 0.01 to 30% by weight, preferably from 0.5 to 20% by weight, relative to the total weight of the non volatile components of the photopolymerizable composition.

The binder can be selected from a wide series of organic polymers. Compositions of different binders can also be used. Useful binders include for example chlorinated polyalkylenes in particular chlorinated polyethylene and chlorinated polypropylene; poly(methacrylic acid) alkyl esters or alkenyl esters in particular poly(methyl(meth)acrylate), poly(ethyl (meth)acrylate), poly(butyl(meth)acrylate), poly(isobutyl (meth)acrylate), poly(hexyl(meth)acrylate), poly((2-ethylhexyl) (meth)acrylate) and poly(alkyl(meth)acrylate); copolymers of (meth)acrylic acid alkyl esters or alkenyl esters with other copolymerizable monomers, in particular with (meth)acrylonitrile, vinyl chloride, vinylidene chloride, styrene and/or butadiene; poly(vinyl chloride) (PVC); vinyl-chloride/(meth)acrylonitrile copolymers; poly(vinylidene chloride) (PVDC); vinylidene chloride/(meth)acrylonitrile copolymers; poly(vinyl acetate); poly(vinyl alcohol); poly (meth)acrylonitrile; (meth)acrylonitrile/styrene copolymers; (meth)acrylamide/alkyl (meth)acrylate copolymers; (meth) acrylonitrile/butadiene/styrene (ABS) terpolymers; polystyrene; poly(α-methylstyrene); polyamides; polyurethanes; polyesters; cellulose or cellulose compounds like methyl cellulose, ethyl cellulose, acetyl cellulose, hydroxy-($C_{1-4}$alkyl) cellulose, carboxymethyl cellulose; poly(vinyl formal) and poly(vinyl butyral). Particularly suitable are binders that are insoluble in water, but on the other hand are soluble or at least swellable in aqueous-alkaline solutions. Further effective binders are polymers that are soluble in common organic coating solvents.

Particular suitable for the purpose of the present invention are binders containing carboxyl groups, in particular polymers or copolymers containing monomeric units of α,β-unsaturated carboxylic acids and/or monomeric units of α,β-unsaturated dicarboxylic acids, preferably acrylic acid, methacrylic acid, crotonic acid, vinylacetic acid, maleic acid or itaconic acid. By the term "copolymers" are to be understood in the context of the present invention polymers containing units of at least 2. different monomers, thus also terpolymers and higher mixed polymers. Particular useful examples of copolymers are those containing units of (meth) acrylic acid and units of alkyl(meth)acrylates, allyl(meth) acrylates and/or (meth)acrylonitrile as well as copolymers containing units of crotonic acid and units of alkyl(meth) acrylates and/or (meth)acrylonitrile and vinyl acetic acid/ alkyl(meth)acrylate copolymers. Also suitable are copolymers containing units of maleic anhydride or maleic acid monoalkyl esters. Among those are, for example, copolymers containing units of maleic anhydride and styrene, unsaturated ethers or esters or unsaturated aliphatic hydrocarbons and the esterification products obtained from such copolymers. Further suitable binders are products obtainable from the conversion of hydroxyl-containing polymers with intramolecular dicarboxylic anhydrides. Further useful binders are polymers in which groups with acid hydrogen atoms are present, some or all of which are converted with activated isocyanates. Examples of these polymers are products obtained by conversion of hydroxyl-containing polymers with aliphatic or aromatic sulfonyl isocyanates or phosphinic acid isocyanates. Also suitable are polymers with aliphatic or aromatic hydroxyl groups, for example copolymers containing units of hydroxyalkyl(meth)acrylates, allyl alcohol, hydroxystyrene or vinyl alcohol, as well as epoxy resins, provided they carry a sufficient number of free OH groups.

The organic polymers used as binders have a typical mean molecular weight $M_w$ between 600 and 200 000, preferably between 1 000 and 100 000. Preference is further given to polymers having an acid number between 10 to 250, preferably 20 to 200, or a hydroxyl number between 50 and 750, preferably between 100 and 500. The amount of binder(s) generally ranges from 10 to 90% by weight, preferably 20 to 80% by weight, relative to the total weight of the non-volatile components of the composition.

The polymerizable compound can be selected from a wide series of photo-oxidizable compounds. Suitable compounds contain primary, secondary and in particular tertiary amino groups. Radically polymerizable compounds containing at least one urethane and/or urea group and/or a tertiary amino group are particularly preferred. By the term "urea group" has to be understood in the context of the present invention a group of the formula >N—CO—N<, wherein the valences on the nitrogen atoms are saturated by hydrogen atoms and hydrocarbon radicals (with the proviso that not more than one valence on either of the two nitrogen atoms is saturated by one hydrogen atom). However, it is also possible for one valence on one nitrogen atom to be bonded to a carbamoyl (—CO—NH—) group, producing a biuret structure.

Also suitable are compounds containing a photo-oxidizable amino, urea or thio group, which may be also be a constituent of a heterocyclic ring. Compounds containing photo-oxidizable enol groups can also be used. Specific examples of photo-oxidizable groups are triethanolamino, triphenylamino, thiourea, imidazole, oxazole, thiazole, acetylacetonyl, N-phenylglycine and ascorbic acid groups. Particularly suitable compounds are monomers containing photo-oxidizable groups corresponding to the following formula (XVIII):

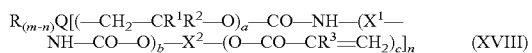

wherein

R represents an alkyl group having 2 to 8 carbon atoms (($C_2$-$C_8$) alkyl group), a ($C_2$-$C_8$) hydroxyalkyl group or a ($C_6$-$C_{14}$) aryl group, Q represents —S—,

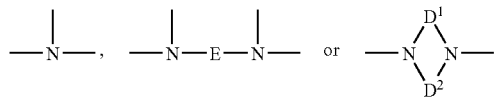

wherein

E represents a divalent saturated hydrocarbon group of 2 to 12 carbon atoms, a divalent 5- to 7-membered, saturated iso- or heterocyclic group, which may contain up to 2 nitrogen, oxygen and/or sulfur atoms in the ring, a divalent aromatic mono- or bicyclic isocyclic group of 6 to 12 carbon atoms or a divalent 5- or 6-membered aromatic heterocyclic group; and $D^1$ and $D^2$ independently represent a saturated hydrocarbon group of 1 to 5 carbon atoms, $R^1$ and $R^2$ independently represent a hydrogen atom, an alkyl or alkoxyalkyl group, $R^3$ represents a hydrogen atom, a methyl or ethyl group, $X^1$ represents a straight-chained or branched saturated hydrocarbon group of 1 to 12 carbon atoms, $X^2$ represents a (c+1)-valent hydrocarbon group in which up to 5 methylene groups may have been replaced by oxygen atoms, a is an integer from 0 to 4, b is 0 or 1, c is an integer from 1 to 3, m is an integer from 2 to 4 and n is an integer from 1 to m.

Compounds of this nature and processes for their preparation are described in EP 287 818. If a compound of general formula (XVIII) contains several radicals R or several radicals according to the structure indicated between square brackets, i.e. if (n-m)>1 and n>1, these radicals can be identical or different from one another. Compounds according to formula (XVIII) wherein n=m are particularly preferred. In this case, all radicals contain polymerizable groups. Preferably, the index a is 1; if several radicals are present, a cannot be 0 in more than one radical. If R is an alkyl or hydroxyalkyl group, R generally contains 2 to 6, particularly 2 to 4 carbon atoms. Aryl radicals R are in general mononuclear or binuclear, preferably however mononuclear, and may be substituted with ($C_1$-$C_5$)alkyl or ($C_1$-$C_5$)alkoxy groups. If $R^1$ and $R^2$ are alkyl or alkoxy groups, they preferably contain 1 to 5 carbon atoms. $R^3$ is preferably a hydrogen atom or a methyl group. $X^1$ is preferably a straight-chained or branched aliphatic and/or cycloaliphatic radical of preferably 4 to 10 carbon atoms. In a preferred embodiment, $X^2$ contains 2 to 15 carbon atoms and is in particular a saturated, straight-chained or branched aliphatic and/or cycloaliphatic radical containing this amount of carbon atoms. Up to 5 methylene groups in these radicals may have been replaced by oxygen atoms; in the case of $X^2$ being composed of pure carbon chains, the radical generally has 2 to 12 carbon atoms, preferably 2 to 6 carbon atoms. $X^2$ can also be a cycloaliphatic group of 5. to 10 carbon atoms, in particular a cyclohexane diyl group. The saturated heterocyclic ring formed by $D^1$, $D^2$ and both nitrogen atoms generally has 5 to 10 ring members in particular 6. ring members. In the latter case the heterocyclic ring is preferably a piperazine and the radical derived therefrom a piperazine-1,4-diyl radical. In a preferred embodiment, radical E is an alkane diyl group which normally contains about 2 to 6 carbon atoms. Preferably the divalent 5- to 7-membered, saturated, isocyclic group E is a cyclohexane diyl group, in particular a cyclohexane-1,4-diyl group. The divalent, isocyclic, aromatic group E is preferably an ortho-, meta- or para-phenylene group. The divalent 5- or 6-membered aromatic heterocyclic group E, finally, contains preferably nitrogen and/or sulphur atoms in the heterocyclic ring. c is preferably 1, i.e. each radical in the square bracket generally contains only one polymerizable group, in particular only one (meth) acryloyloxy-group.

The compounds of formula (XVIII) wherein b=1, which accordingly contain two urethane groups in each of the radicals indicated in the square brackets, can be produced in a known way by conversion of acrylic esters or alkacrylic esters which contain free hydroxyl groups with equimolar amounts of diisocyanates. Excess isocyanate groups are then, for example, reacted with tris(hydroxyalkyl)amines, N,N'-bis(hydroxyalkyl)piperazines or N,N,N',N'-tetrakis(hydroxy alkyl)alkylenediamines, in each of which individual hydroxyalkyl groups may have been replaced by alkyl or aryl groups R. If a=0, the result is a urea grouping. Examples of the hydroxyalkylamine starting materials are diethanolamine, triethanolamine, tris(2-hydroxypropyl)amine, tris(2-hydroxybutyl)amine and alkyl-bis-hydroxyalkylamines.

Examples of suitable diisocyanates are hexamethylene diisocyanate, 2,2,4-trimethylhexamethylene diisocyanate, 1,4-cyclohexylene diisocyanate (=1,4-diisocyanatocyclohexane) and 1,1,3-trimethyl-3-isocyanatomethyl-5-isocyanatocyclohexane. The hydroxy-containing esters used are preferably hydroxyethyl(meth)acrylate, hydroxypropyl(meth)acrylate and hydroxyisopropyl(meth)acrylate.

The polymerizable compounds of formula (XVIII) wherein b=0 are prepared converting the above-described hydroxyalkylamino compounds with isocyanate-containing acrylic or alkacrylic esters. A preferred isocyanate-containing ester is isocyanoto-ethyl(meth)acrylate.

Further polymerizable compounds comprising photooxidisable groups suitable for the purpose of the invention are compounds according to the following formula (XIX):

$$R_{(m-n)}Q[(-CH_2-CR^1R^2-O)_{a'}-(CH_2-CH[CH_2-O-CO-CR^3=CH_2]-O)_{b'}-H]_n \quad (XIX)$$

wherein a' and b' independently represent integers from 1 to 4 and Q, $R^1$, $R^2$, $R^3$, n and m have the same meaning as above and Q can also be a group of the formula >N-E'-N< wherein the radical E' corresponds to the following formula (XX):

$$-CH_2-CH(OH)-CH_2-[O-(p)C_6H_4-C(CH_3)_2-(p)C_6H_4-CH_2CH(OH)-CH_2-]_c \quad (XX)$$

wherein c has the same meaning as in formula (I) and (p)$C_6H_4$ represents para-phenylene.

The compounds of formula (XIX) are prepared analogously to those of formula (XVIII), except that the conversion products of hydroxyalkyl acrylates or alkacrylates and diisocyanates are replaced by the corresponding acrylic and alkacrylic glycide esters. Compounds of formula (XX) and processes to their preparation are disclosed in EP 316 706.

Further useful polymerizable compounds containing photooxidisable groups are acrylic and alkacrylic esters of the following formula (XXI):

$$Q'[(-X^{1'}-CH_2-O)_a-CO-NH(-X^1-NH-CO-O)_b-X^2-O-CO-CR^3=CH_2]_n \quad (XXI)$$

wherein

Q' represents

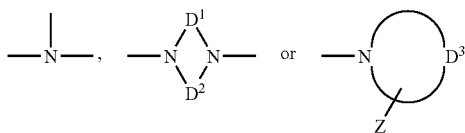

wherein $D^1$ and $D^2$ independently represent a saturated hydrocarbon group of 1 to 5 carbon atoms and $D^3$ represents a saturated hydrocarbon group of 4 to 8 carbon atoms, which together with the nitrogen atom forms a 5- or 6-membered heterocyclic ring;

$X^{1'}$ represents —$C_iH_{2i}$— or

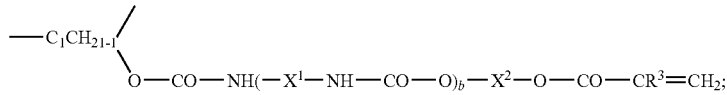

Z represents a hydrogen atom or a radical of the following formula:

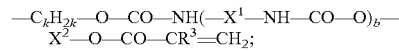

i,k independently represent integers from 1 to 12;
n' represents an integer from 1 to 3; and
a is 0 or 1; provided that a is 0 in at least one of the radicals bonded to Q;
$X^1$, $R^3$, a and b have the same meaning as given in the above formula (VIII); and
$X^2$ represents a divalent hydrocarbon group in which up to 5. methylene groups may be replaced by oxygen atoms.

In formula (XXI) index a is preferably 0 or 1 and i preferably represents a number between 2 and 10. Preferred radicals Q are piperazine-1,4-diyl ($D^1$=$D^2$=$CH_2$—$CR_2$), piperidine-1-yl ($D^3$=$(CH_2)_5$, Z=H) and 2-(2-hydroxyethyl)-piperidine-1-yl ($D^3$=$(CH_2)_5$, Z=$CH_2CH_2OH$).

Of the compounds of formula (XX), those which apart from a urea group contain at least one urethane group are preferred. Here again, by the term "urea group" has to be understood the group of formula >N—CO—N< already mentioned above. Compounds of formula (XXI) and processes for their preparation are disclosed in EP 355 387.

Also suitable polymerizable compounds are reaction products of mono- or diisocyanates with multifunctional alcohols, in which the hydroxy groups are partly or completely esterified with (meth)acrylic acid. Preferred compounds are materials, which are synthesized by the reaction of hydroxyalkyl-(meth)acrylates with diisocyanates. Such compounds are basically known and for instance described in DE 28 22 190 and DE 20 64 079.

The amount of polymerizable compound comprising photooxidisable groups generally ranges from 5 to 75% by weight, preferably from 10 to 65% by weight, relative to the total weight of the non volatile compounds of the photopolymerizable composition.

Moreover, the composition can contain polyfunctional (meth)acrylate or alkyl(meth)acrylate compounds as crosslinking agents. Such compounds contain more than 2, preferably between 3 and 6 (meth)acrylate and/or alkyl(meth)acrylate groups and include in particular (meth)acrylates of saturated aliphatic or alicyclic trivalent or polyvalent alcohols such as trimethylol ethane, trimethylol propane, pentaerytritol or dipentaerythritol.

The total amount of polymerizable compounds generally ranges from about 10 to 90% by weight, preferably from about 20 to 80% by weight, relative to the total weight of the non volatile components of the photopolymerizable composition of the present invention.

The following specific example is also a suitable polymerizable compound:

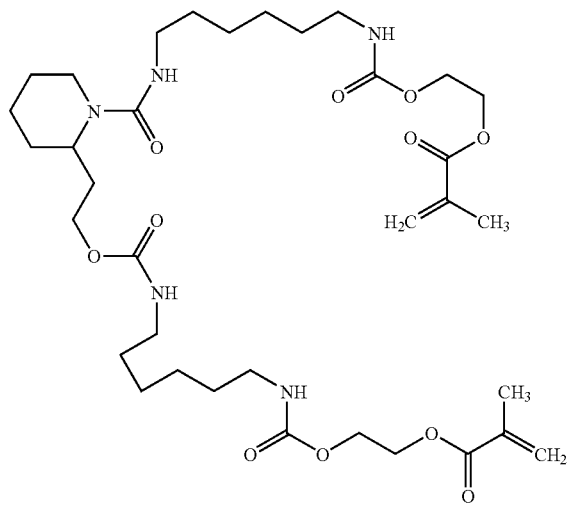

In order to achieve a high sensitivity, it is advantageous to add a radical chain transfer agent as described in EP 107 792 to the photopolymerizable composition of the present invention. The preferred chain transfer agents are sulfur containing compounds, especially thiols like e.g. 2-mercaptobenzothiazole, 2-mercaptobenzoxazole or 2-mercapto-benzimidazole. The amount of chain transfer agent generally ranges from 0.01 to 10% by weight, preferably from 0.1 to 2% by weight, relative to the total weight of the non volatile components of the photopolymerizable composition.

Optionally pigments, e.g. predispersed phthalocyanine pigments, can be added to the composition of the present invention for dyeing the composition and the layers produced therewith. Their amount generally ranges from about 1 to 15% by weight, preferably from about 2 to 7% by weight related to the total weight of the non volatile components of the composition. Particularly suitable predispersed phthalocyanine pigments are disclosed in DE 199 15 717 and DE 199 33 139. Preference is given to metal-free phthalocyanine pigments.

In order to adjust the photopolymerizable composition according to the present invention to specific needs, thermal inhibitors or stabilizers for preventing thermal polymerization may be added. Furthermore additional hydrogen donors, dyes, colored or colorless pigments, color formers, indicators and plasticisers may be present. These additives are conveniently selected so that they absorb as little as possible in the actinic range of the imagewise applied radiation.

The present invention also relates to a photopolymer printing plate precursor comprising a layer (photopolymerizable layer) containing the photopolymerizable composition of the present invention on a support.

The photopolymerizable composition according to the present invention is applied to the support by processes which are known per se to the person skilled in the art. In general, the components of the photopolymerizable composition are dissolved or dispersed in an organic solvent or solvent mixture, the solution or dispersion is applied to the intended support by pouring on, spraying on, emersion, roll application or in a similar and the solvents are removed during the subsequent drying.

The known supports can be used for the photopolymer printing plate of the present invention, like e.g. foils, tapes or plates made of metal or plastics and in the case of screen-printing also of Perlon gauze. Preferred metals are aluminium, aluminium alloys, steel and zinc, aluminium and aluminium alloys being particularly preferred. Preferred plastics are polyester and cellulose acetates, polyethyleneterephthalate (PET) being particularly preferred.

In most cases it is preferred, to treat the surface of the support mechanically and/or chemically and/or electrochemically to optimally adjust the adherence between the support and the photosensitive coating and/or to reduce the reflection of the imagewise exposed radiation on the surface of the support (antihalation).

The most preferred support to be used for the present invention is made of aluminium or an aluminium alloy, its surface is electrochemically roughened, thereafter anodize and optionally treated with a hydrophilizing agent like e.g. poly(vinylphosphonic acid).

The printing plate precursors of the present invention preferably have a protective layer (overcoat layer) provided on top of the photopolymerizable layer.

Said protective layer may contain the ingredients known in the art, in particular water soluble polymers like poly(vinyl alcohols) or poly(vinyl pyrrolidone), surface wetting agents, coloring agents, complexants and biocides. Among said complexants, ethoxylated ethylene diamine compounds have been found to be particularly preferred for the present invention.

Preferably the protective overcoat according to the present invention comprises at least one type of poly(vinyl alcohol), wherein the mean degree of saponification is less thin 93. mol-%.

The degree of saponification is related to the production of poly(vinyl alcohols). As the monomer of poly(vinyl alcohol), vinyl alcohol, is nonexistent, only indirect methods are available for the production of poly(vinyl alcohol). The most important manufacturing process for poly(vinyl alcohol) is the polymerization of vinyl esters or ethers, with subsequent saponification or transesterification. The preferred starting material for the poly(vinyl alcohol) of the present invention is a vinyl alcohol esterified by a mono carboxylic acid and in particular vinyl acetate, but derivatives of vinyl acetate, vinyl esters of di carboxylic acids, vinyl ethers and the like can also be used. The degree of saponification as defined for the present invention is the molar degree of hydrolysis irrespective of the process used for the hydrolysis. Pure poly (vinyl alcohol) has e.g. a degree of saponification of 100 mol-%, but commercial products often have a degree of saponification of 98 mol-%. The poly(vinyl alcohols) as preferably used for the present invention contain mainly 1,3-diol units, but may also contain small amounts of 1,2-diol units. In the partially saponified poly(vinyl alcohols) the ester or the ether group can be distributed statistically or blockwise. Preferred partially saponified poly(vinyl alcohols) of the present invention have a viscosity of a 4% aqueous solution at 20° C. of 4 to 60 mPa·s, preferably of 4 to 20 mPa·s and in particular of 4. to 10. mPa·s.

Poly(vinyl alcohols) preferred for the present invention are commercially available e.g. under the tradename Mowiol. Those products are characterised by two appended numbers, meaning the viscosity and the degree of saponification. For example, Mowiol 8-88 or Mowiol 8/88 mean a poly(vinyl alcohol) having as 4% aqueous solution at 20° C. a viscosity of ca 8 mPa·s and a degree of saponification of 88 mol-%. It is further preferred to use a mixture of two or more compounds. Preferably poly(vinyl alcohols) differing in viscosity as defined above and/or in saponification degree are combined. Particularly preferred are mixture of poly(vinyl alcohols) that differ in viscosity of their 4% aqueous solutions at 20° C. for at least 2 mPa·s or that differ in saponification degree for at least 5 mol-%. Most preferred are mixtures comprising at least 3 types of poly(vinyl alcohols), wherein at least two compounds differ in viscosity as defined above for at least 2 mPa·s and at least two compounds differ in saponification degree for at least 5 mol-%.

Preferably the overall mean saponification degree of all poly(vinyl alcohols) used in the protective layer has to be less than 93 mol-%. In a further preferred embodiment of the present invention said overall mean saponification degree ranges from 71 mol-% to less than 93 mol-% and in particular from 80 mol-% to 92,9mol-%.

The overall mean saponification degree of the poly(vinyl alcohols) used in the protective overcoat of a printing plate precursor can be determined experimentally via $^{13}$C-NMR. To measure the $^{13}$C-NMR spectra, approximately 200 mg of the protective overcoat are dissolved in 1.0 ml DMSO and from this solution a 75 MHz $^{13}$C-NMR spectrum is taken, whose resonances can easily be interpreted and allow to calculate the degree of saponification (experimental values). A good correlation is obtained between said experimental values and the values known from the product specification of the poly(vinyl alcohols). The latter values are hereinafter called theoretical values of the mean saponification degree and can easily be calculated, when mixture of poly(vinyl alcohols) are used.

Preferably the poly(vinyl alcohol) of the present invention is used in 50 to 99.9 weight percent (wt. %) relative to the total weight of the non-volatile compounds of the protective overcoat. Additionally other water soluble polymers can be added to the layer such as poly(vinyl pyrrolidone), poly(ethylene oxide), gelatin, gum arabic, oxygen binding polymers with aliphatic amine groups known from EP 352 630 B1, methyl vinylether/maleic anhydride copolymers, poly(carboxylic acids), copolymers of ethylene oxide and poly(vinyl alcohol), carbon hydrates, hydroxy ethyl cellulose, acidic cellulose, cellulose, poly(arylic acid) and mixtures of these polymers.

Preferably the poly(vinyl pyrrolidone) is only used in small quantities compared to the poly(vinyl alcohol). In a preferred embodiment of the present invention poly(vinyl pyrrolidone) is used from 0 to 10 parts by weight of the poly(vinyl alcohol) used, from 0 to 3 parts by weight being particularly preferred. Most preferred no poly(vinyl pyrrolidone)compounds are used.

In addition to the poly(vinyl alcohol) of the present invention and the optional watersoluble polymers disclosed above, the known ingredients of protective layers can be used.

The protective layer has to be transparent for actinic light and preferably has a dry thickness of 0.2 to 10 g/m², 1.0 to 5 g/m² being particularly preferred. Preferably it is homogeneous, substantially impermeable to oxygen, waterpermeable, and can be washed off preferably with the conventional developer solutions used to form a printing relief after imagewise exposure of the photosensitive layer. Said photopolymerizable layer is removed imagewise, whereas the protective layer is removable over the entire area of the element created. The wash-off of the protective layer can be done in a separate step, but can be done during the development step as well.

The protective layer can be coated on the photosensitive layer with known techniques and the coating solution preferably contains water or a mixture of water and an organic solvent. To allow a better wetting, the coating solution preferably contains, related to the solid content, up to 10 wt. %, and particular preferred up to 5 wt. % of a surface active agent. Suitable representatives of surface active agents comprise anionic, cationic and nonionic surface active agents like sodium alkylsulfates and -sulfonates having 12 to 18 carbon atoms, an example of which is sodium dodecylsulfate, N-cetyl- and C-cetyl betaine, alkylaminocarboxylate and -dicarboxylate, and polyethylene glycols with a mean molar weight up to 400.

In addition, further functions can be added to the protective layer. For example, it can be possible to improve the safelight suitability without decreasing the sensitivity of the layer by adding a coloring agent, e.g. a water-soluble dye, that has excellent transmission to the light having a wavelength of 300 to 450 nm and that absorbs the light having a wavelength of 500 nm or more. This principle can easily be varied for different wavelengths to adjust the effective spectral sensitivity distribution of the printing plate precursor as needed.

The present invention also relates to a method of making a lithographic printing plate comprising the steps of providing a photopolymer printing plate precursor of the present invention, exposing said printing plate precursor with a laser having an emission wavelength in the range from 300 to 450 nm and processing the printing plate precursor in an aqueous alkaline developer.

In preferred embodiment of the process of the present invention the exposure is done with a laser having an emission wavelength in the range from 380 to 430 nm, in particular in the range from 390 to 420 nm, and the exposure is carried out at an energy density, measured on the surface of the plate, of 100 µJ/cm² or less.

The processing of the printing plate precursor of the present invention is done in the usual manner. After imagewise exposure a pre-heat step is performed to improve the crosslinking of the photosensitive layer. Usually the pre-heat step is then followed by the development step, wherein the complete overcoat layer and the unexposed part of the photosensitive layer are removed. The removal (wash-off) of the overcoat layer and the development of the photosensitive layer can be done in two seperate steps in this order, but can also be done in one step simultaneously. Preferably the overcoat layer is washed-off with water before the development step. What remains on the support after the development step are the exposed and thereby photopolymerized parts of the photosensitive layer. The developer solution used for the development of the exposed printing plate precursors of the present invention preferably is an aqueous alkaline solution having a pH of at least 11, a pH from 11.5 to 13.5 being particularly preferred. The developer solution can contain a small percentage, preferably less than 5 wt. %, of an organic, water-miscible solvent. To adjust the pH of the solution, an alkali hydroxide is preferably used.

Examples of preferred, additional ingredients of the developer solution comprise alone or in combination alkali phosphates, alkali carbonates, alkali bicarbonates, an organic amine compound, alkali silicates, buffering agents, complexants, defoamers, surface active agents and dyes, but the suitable ingredients are not limited to the preferred examples and further ingredients can be used.

The method of development employed is not particularly limited, and may be conducted by soaking and shaking the plate in a developer, physically removing non-image portions while being dissolved in a developer by means of e.g. a brush, or spraying a developer onto the plate so as to remove non-image portions. The time for development is selected depending upon the above method used so that the non-image portions can adequately by removed, and is optionally selected within a range of 5 seconds to 10 minutes.

After the development, the plate my be subjected to a hydrophilic treatment by means of, e.g., gum arabic optionally applied to the printing plate as the case requires (gumming step).

EXAMPLES

Examples 1 to 6 and Comparative Examples 1 and 2

Solubility Test in Methyl Ethyl Ketone 1.5 g of the sensitiser is dissolved in 100g of methyl ethyl ketone and allowed to stir at room temperature (20° C.) for a maximum of 24 hours. If the sensitiser is completely dissolved in the methyl ethyl ketone, the sensitiser passes the solubility test and is considered as a preferred sensitiser according to the present invention.

In the table below the results of the solubility tests are given for the different sensitisers:

| Component | Structure | Solubility test MEK (15 g/kg) |
|---|---|---|
| (C) | 1,4-distyryl-3,4,5-trimethoxybenzene | Not OK |
| (D) | (III-1) | OK |
| (E) | (III-9) | OK |
| (F) | (III-6) | OK |

These results demonstrate the low solubility of component C that is used in the comparative examples 1 and 2.

Test of Sensitiser Compatibility in the Layer Composition

A. Preparation (Coating) of the Photosensitive Layer

A composition was prepared (pw=parts per weight; wt. %=weight percentage) by mixing the components (A) to (M) as specified in table 1. This composition was coated on an electrochemically roughened and anodically oxidized aluminum sheet, the surface of which has been rendered hydrophilic by treatment with an aqueous solution of polyvinyl phosphonic acid (oxide weight 3 g/m$^2$) and dried for 2 minutes at 110° C. (circulation oven). The resulting thickness of the layer is 1.4 g/m$^2$.

Components (D) to (F) are various optical brighteners according to the present invention. All the sensitisers are used in equimolar concentrations. Two levels of concentration are evaluated for each sensitiser.

TABLE 1

Composition of the coating solutions (amounts expressed as parts per weight), layer thickness and presence of crystal like pinholes

| Component | Comp. Ex. 1 | Comp Ex. 2 | Ex. 1 | Ex. 2 | Ex. 3 | Ex. 4 | Ex. 5 | Ex. 6 |
|---|---|---|---|---|---|---|---|---|
| (A) | 188.57 | 181.33 | 183.38 | 174.80 | 181.88 | 172.96 | 176.45 | 166.14 |
| (B) | 166.24 | 166.24 | 166.24 | 166.24 | 166.24 | 166.24 | 166.24 | 166.24 |
| (C) | 9.28 | 11.63 | — | — | — | — | — | — |
| (D) | — | — | 10.97 | 13.74 | — | — | — | — |
| (E) | — | — | — | — | 11.45 | 14.34 | — | — |
| (F) | — | — | — | — | — | — | 13.21 | 16.55 |
| (G) | 204.00 | 204.00 | 204.00 | 204.00 | 204.00 | 204.00 | 204.00 | 204.00 |
| (H) | 16.58 | 16.58 | 16.58 | 16.58 | 16.58 | 16.58 | 16.58 | 16.58 |
| (I) | 0.77 | 0.77 | 0.77 | 0.77 | 0.77 | 0.77 | 0.77 | 0.77 |
| (J) | 25.50 | 25.50 | 25.50 | 25.50 | 25.50 | 25.50 | 25.50 | 25.50 |
| (K) | 896.01 | 900.90 | 899.52 | 905.32 | 900.51 | 906.72 | 904.20 | 911.17 |
| (L) | 1493.06 | 1493.06 | 1493.06 | 1493.06 | 1493.06 | 1493.06 | 1493.06 | 1493.06 |
| coating weigth (g/m$^2$) | 1.50 | 1.50 | 1.50 | 1.50 | 1.50 | 1.50 | 1.50 | 1.50 |
| Pinholes (2 d. 57° C. 34% RH) | Yes | Yes | No | No | No | No | No | No |

(A): A solution containing 32.4 wt. % of a methacrylate/methacrylic acid copolymer (ratio methylmethacrylate: methacrylic acid of 4:1 by weight; acid number: 110 mg KOH/g) in 2-butanone (viscosity 105 mm$^2$/s at 25° C.).
(B): A solution containing 88.2 wt. % of a reaction product from 1 mole of 2,2,4-trimethylhexamethylenediisocyanate and 2 moles of hydroxyethylmethacrylate (viscosity 3.30 mm$^2$/s at 25° C.).
(C): 1,4-distyryl-3,4,5-trimethoxybenzene.
(D): 1,4-distyryl-(3,5-trimethoxy, 4-(2-butyl)oxy)benzene.
(E): 1,4-distyryl-(3,5-trimethoxy, 4-(2-pentyl)oxy)benzene.
(F): 1,4-distyryl-(3,5-trimethoxy, 4-(1-(2-ethyl)hexyl)oxy)benzene.
(G): Heliogene blue D 7490 ® dispersion (9.9 wt. %, viscosity 7.0 mm$^2$/s at 25° C.), trade name of BASF AG.
(H): 2,2'-Bis(2-chlorophenyl)-4,4',5,5'-tetraphenyl-1,2-bisimidazole.
(I): 2-Mercaptobenzothiazole.
(J): Edaplan LA 411 ® (1% in Dowanol PM ®, trade mark of Dow Chemical Company).
(K): 2-Butanone.
(L): Propyleneglycol-monomethylether (Dowanol PM ®, trade mark of Dow Chemical Company).

B. Preparation (Coating) of the Top Coat Layer

On top of the photo layer a solution in water containing 4.9 wt. % of the following composition was coated and dried for 2 minutes at 110° C.:
1.0 pw of partially hydrolyzed polyvinylalcohol (degree of hydrolysis 87.7%, viscosity 8 mPa·s in a solution of 4 wt. % at 20° C.),
1.0 pw of fully hydrolyzed polyvinylalcohol (degree of hydrolysis 98.4%, viscosity 4 mPa·s in a solution of 4 wt. % at 20° C.) and
0.5 pw of polyvinylpyrrolidone (k-value 30).

The top coat had a dry thickness of 2.0 g/m$^2$.

C. Evaluation of the Appearance of Pinholes

Next the plates were stored for 2 days in an environment at 57° C. and 34% relative humidity. After this storage test the plates were imaged with an experimental violet platesetter device (flat bed system) equipped with a violet laser diode emitting between 392-417 nm. The following imaging conditions were used:
  Scanning speed: 1000 m/sec
  Image plane power: 10.5 mW
  Spot diameter: 20 μm
  Addressability: 1270 dpi As test file a solid of 10 cm×10 cm was imaged.

After imaging the plate was processed in a Agfa VSP85 processor at a speed of 1.2 m/min. First the plate was heated (pre-heat) to a temperature at the back: of the plate of 104° C. Next the overcoat was washed off and finally the photolayer was processed in a water based alkaline developer (Agfa EN 231C) at 28° C. After a water rinsing and gumming step a solid image of 10 cm×10 cm was obtained. This image was inspected on 'crystal-like' pinhole defects and the results are summarised in table 1. With the results it is clearly shown, that the sensitizers of the present invention allow to prepare printing plate precursors, that even after storage result in printing plates without pinhole defects.

The invention claimed is:

1. A composition that is photopolymerizable upon absorption of light in the wavelength range from 300 to 450 nm, the composition comprising a binder, a polymerizable compound, a sensitizer and a photoinitiator, wherein the sensitizer is an optical brightening agent having a solubility in methyl ethyl ketone of at least 15 g/kg measured at 20° C., wherein the sensitized has a structure according to formula (IIIa) or (IVa):

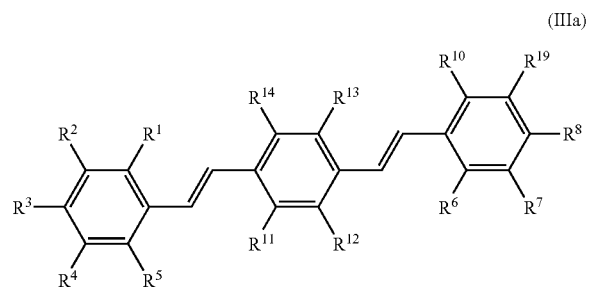

(IIIa)

$R^1$, $R^5$, $R^6$, $R^{10}$, $R^{11}$, $R^{12}$, $R^{13}$ and $R^{14}$ independently represent a hydrogen atom, a fluorine atom or a chlorine atom,
$R^2$ to $R^4$ and $R^7$ to $R^9$ independently represent alkoxy groups,
and at least two of the alkoxy groups are branched and have from 3 to 15 carbon atoms or

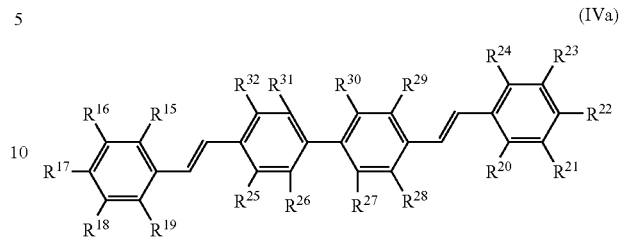

(IVa)

$R^{15}$, $R^{19}$, $R^{20}$, $R^{24}$, and $R^{25}$, to $R^{32}$, independently represent a hydrogen atom, a fluorine atom or a chlorine atom, and
$R^{16}$ to $R^{18}$ and $R^{21}$ to $R^{23}$, independently are alkoxy groups, and at least two of the alkoxy groups are branched and have from 3 to 15 carbon atoms.

2. The composition according to claim 1, wherein the sensitizer has a structure according to formula IIIa, wherein $R^1$, $R^5$, $R^6$, and $R^{10}$ represent a hydrogen atom,
$R^2$, $R^4$, $R^7$, and $R^9$ independently represent a methoxy group, and
$R^3$ and $R^8$ independently are branched alkoxy groups having 3 to 15 carbon atoms.

3. The composition according to claim 1, wherein the sensitizer has a structure according to formula IVa, wherein $R^{15}$, $R^{19}$, $R^{20}$, and, $R^{24}$ represent a hydrogen atom, $R^{16}$, $R^{18}$, $R^{21}$, and $R^{23}$ independently represent a methoxy group, and $R^{17}$ and $R^{22}$ independently are branched alkoxy groups having 3 to 15 carbon atoms.

4. A composition according to claim 1, wherein the photoinitiator is a hexaarylbisimidazole.

5. A composition according to claim 1, wherein the binder is a polymer or copolymer containing monomeric units of an α,β-unsaturated carboxylic acid and/or an α,β-unsaturated dicarboxylic acid.

6. A composition according to claim 1, further comprising a polyfunctional (meth)acrylate or alkyl(meth)acrylate as a crosslinking agent.

7. A composition according to claim 1, wherein the polymerizable compound contains one or more of a urethane, a urea group, or a tertiary amino group.

8. A composition according to claim 1, further comprising a radical chain transfer agent.

9. The composition according to claim 8, wherein the radical chain transfer agent is a sulfur containing compound.

10. The composition according to claim 1, wherein the wavelength range is between 350 and 430 nm.

11. A photopolymer printing plate precursor comprising a photosensitive coating, the coating comprising the composition of claim 1.

12. A method of making a lithographic printing plate comprising the steps of providing a photopolymer printing plate precursor according to claim 11, exposing said printing plate precursor with a laser having an emission wavelength in the range from 300 to 450 nm and processing the lithographic printing plate precursor in an aqueous alkaline developer.

13. The method according to claim 12, wherein the laser has an emission wavelength in the range of 380 to 430 nm.

14. The method of claim 10, wherein the exposure of the lithographic printing plate precursor is carried out at an energy density, measured on the plate surface, of less than 100 μJ/cm$^2$.

15. The method of claim 12, wherein the exposure of the lithographic printing plate precursor is carried out at an energy density, measured on the plate surface, of less than 100 µJ/cm$^2$.

16. The method of claim 13, wherein the exposure of the lithographic printing plate precursor is carried out at an energy density, measured on the plate surface, of less than 100 µJ/cm$^2$.

17. A sensitizer according to formula (IIIa) or formula (IVa)

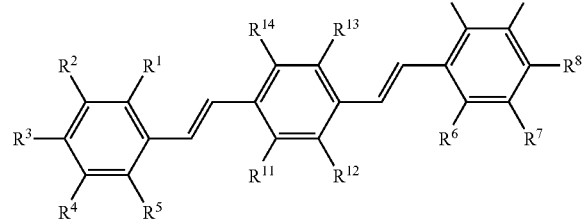

(IIIa)

wherein $R^1$, $R^5$, $R^6$, $R^{10}$, $R^{11}$, $R^{12}$, $R^{13}$ and $R^{14}$ independently represent a hydrogen atom, a fluorine atom or a chlorine atom, and $R^2$ to $R^4$ and $R^7$ to $R^9$ independently represent alkoxy groups, and at least two of the alkoxy groups are branched and have from 3 to 15 carbon atoms or

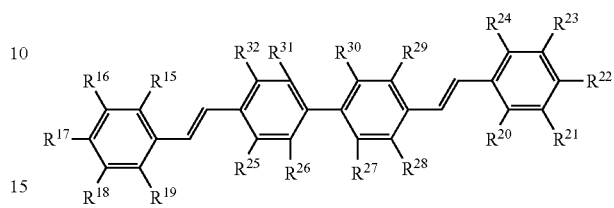

(IVa)

wherein $R^{15}$, $R^{19}$, $R^{20}$, $R^{24}$, and $R^{25}$ to $R^{32}$, independently represent a hydrogen atom, a fluorine atom or a chlorine atom, and $R^{16}$ to $R^{18}$ and $R^{21}$ to $R^{23}$, independently are alkoxy groups, and at least two of the alkoxy groups are branched and have from 3 to 15 carbon atoms.

* * * * *